United States Patent
Yoo et al.

(10) Patent No.: US 9,577,598 B2
(45) Date of Patent: Feb. 21, 2017

(54) THIN FILM TYPE COMMON MODE FILTER

(71) Applicant: Samsung Electro-Mechanics Co., Ltd., Gyeonggi-do (KR)

(72) Inventors: Young Seuck Yoo, Gyeonggi-do (KR); Kang Heon Hur, Gyeonggi-do (KR); Young Ghyu Ahn, Gyeonggi-do (KR); Chan Yoon, Gyeonggi-do (KR); Sung Kwon Wi, Gyeonggi-do (KR); Jeong Min Cho, Gyeonggi-do (KR); Geon Se Chang, Gyeonggi-do (KR); Young Do Kweon, Gyeonggi-do (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 443 days.

(21) Appl. No.: 13/830,916

(22) Filed: Mar. 14, 2013

(65) Prior Publication Data

US 2014/0062615 A1 Mar. 6, 2014

(30) Foreign Application Priority Data

Aug. 29, 2012 (KR) .......................... 10-2012-0094775

(51) Int. Cl.
*H03H 7/01* (2006.01)
*H03H 7/42* (2006.01)
(Continued)

(52) U.S. Cl.
CPC ........ *H03H 7/0138* (2013.01); *H01F 17/0013* (2013.01); *H03H 7/427* (2013.01);
(Continued)

(58) Field of Classification Search
CPC ............ H03H 7/427; H03H 2001/0085; H03H 7/0138; H03H 2001/0057; H01F 17/0013
(Continued)

(56) References Cited

U.S. PATENT DOCUMENTS 6,768,410 B1 7/2004 Yazaki et al.
2003/0052748 A1* 3/2003 Kariya et al. ................. 333/185
(Continued)

FOREIGN PATENT DOCUMENTS

| CN | 1461488 A | 12/2003 |
|----|-----------|---------|
| JP | 05-006823 | 1/1993 |
| JP | 2009-218644 | 9/2009 |

OTHER PUBLICATIONS

Chinese Office Action issued in Chinese Application No. 201310138329.X, dated Jul. 19, 2016, with English Translation.

*Primary Examiner* — Stephen E Jones
*Assistant Examiner* — Rakesh Patel
(74) *Attorney, Agent, or Firm* — McDermott Will & Emery LLP

(57) ABSTRACT

Disclosed herein is a thin film type common mode filter including: a base substrate made of an insulating material; a first insulating layer formed on the base substrate; a coil-shaped internal electrode formed on the first insulating layer; a second insulating layer formed on the internal electrode; an external electrode terminal having a vertical section connected to a side surface of the internal electrode and a horizontal section extended from an upper end of the vertical section toward a horizontal direction to thereby form a parallel surface spaced apart from the internal electrode by a predetermined distance; and a ferrite resin layer formed between the horizontal section of the external electrode terminal and the internal electrode.

7 Claims, 4 Drawing Sheets

(51) Int. Cl.
*H01F 17/00* (2006.01)
*H03H 1/00* (2006.01)

(52) U.S. Cl.
CPC ............... *H01F 2017/0066* (2013.01); *H01F 2017/0093* (2013.01); *H03H 2001/0057* (2013.01)

(58) Field of Classification Search
USPC .......................................... 333/12, 181, 185
See application file for complete search history.

(56) References Cited

U.S. PATENT DOCUMENTS

| | | | | |
|---|---|---|---|---|
| 2003/0134612 | A1* | 7/2003 | Nakayama et al. | 455/307 |
| 2009/0251268 | A1* | 10/2009 | Sato | 336/200 |
| 2012/0019272 | A1* | 1/2012 | Kawahara et al. | 324/750.01 |
| 2014/0362491 | A1* | 12/2014 | Adachi et al. | 361/270 |

* cited by examiner

- PRIOR ART -

30

| CLASSIFICATION | RDC | Z_CM(@100MHz) | SRF | CUTOFF FREQUENCY |
|---|---|---|---|---|
| REFERENCE MODEL | 2.528 Ω | 107.6 Ω | 474.5 MHz | 2.789 GHz |
| EXTERNAL ELECTRODE MODIFICATION | | 121.5 Ω | 500.5 MHz | 2.789 GHz |

THIN FILM TYPE COMMON MODE FILTER

CROSS REFERENCE(S) TO RELATED APPLICATIONS

This application claims the benefit under 35 U.S.C. Section 119 of Korean Patent Application Serial No. 10-2012-0094775, entitled "Thin Film Type Common Mode Filter" filed on Aug. 29, 2012, which is hereby incorporated by reference in its entirety into this application.

BACKGROUND OF THE INVENTION

1. Technical Field

The present invention relates to a thin film type common mode filter, and more particularly, to a thin film type common mode filter in which a ferrite resin layer is formed in a spaced space between the horizontal section of the external electrode terminal and an internal electrode to decrease a parasitic capacitance component.

2. Description of the Related Art

Recently, electronic devices such as cellular phones, electric home appliances, personal computers (PCs), personal digital assistants (PDAs), liquid crystal displays (LCDs), navigations, or the like, have been digitized and accelerated. Since the electronic devices are susceptible to stimulus from the outside, a circuit is easily damaged or a signal is distorted in the case in which a small level of abnormal voltage and a high frequency noise are introduced from the outside into an internal circuit of the electronic device.

The abnormal voltage and the noise are resulted from a switching voltage generated in the circuit, a power supply noise included in a power supply voltage, unnecessary electromagnetic signal, and an electromagnetic noise, or the like, and a common mode filter (CMF) has been used as a means for preventing the abnormal voltage and the high frequency noise from being introduced to the circuit.

In general, in a differential signal transmission system, a passive component such as a diode, a varistor, or the like, has been separately used in order to suppress an electro static discharge (ESD) generated at input and output terminals together with the CMF for removing a common mode noise.

FIG. 1 is a schematic diagram showing a common mode filter structure of the related art. Referring to FIG. 1, the general common mode filter includes a base substrate 1, a first insulating layer 2 formed on the base substrate 1, an internal electrode 3 formed on the first insulating layer 2, a second insulating layer 4 formed on the first insulating layer 2 so as to receive the internal electrode 3, an external electrode terminal 5 formed on the second insulating layer 4 so as to ground an exposed end of the internal electrode 3, and a ferrite resin layer 6 formed on the second insulating layer 4.

However, in the above-mentioned common mode filter of the related art, a parasitic capacitance is generated due to structural properties.

In particular, as shown in part "A" of FIG. 1, the parasitic capacitance is intensively generated at different electrified circuits, that is, above and below a vicinity at which the internal electrode 3 and the external electrode terminal 5 are mutually close to each other, in particular, in the vicinity of a boundary therebetween.

The parasitic capacitance is a main reason that a self resonant frequency (SRF) is damaged.

SUMMARY OF THE INVENTION

An object of the present invention is to provide a thin film type common mode filter capable of decreasing a parasitic capacitance component by including a ferrite resin layer formed in a spaced space between a horizontal section of an external electrode terminal and an internal electrode in the common mode filter.

Another object of the present invention is to provide a thin film type common mode filter in which series resistance is maintained and impedance is improved to provide an excellent filtering effect, and a self resonant frequency (SRF) is improved to allow a frequency range capable of implementing performance to be wide, and in particular, the filtering is excellent at a high frequency.

According to an exemplary embodiment of the present invention, there is provided a thin film type common mode filter including an external electrode terminal having a vertical section and a horizontal section; an internal electrode having a side surface to which the vertical section of the external electrode terminal is connected; and a ferrite resin layer formed in a spaced space between the horizontal section of the external electrode terminal and the internal electrode to decrease a parasitic capacitance component.

According to another exemplary embodiment of the present invention, there is provided a thin film type common mode filter including: a base substrate made of an insulating material; a first insulating layer formed on the base substrate; a coil-shaped internal electrode formed on the first insulating layer; a second insulating layer formed on the internal electrode; an external electrode terminal having a vertical section connected to a side surface of the internal electrode and a horizontal section extended from an upper end of the vertical section toward a horizontal direction to thereby form a parallel surface spaced apart from the internal electrode by a predetermined distance; and a ferrite resin layer formed between the horizontal section of the external electrode terminal and the internal electrode.

The base substrate may be made of a ferrite.

The first insulating layer and the second insulating layer may be made of any one material selected from the group consisting of polyimide, an epoxy resin, benzocyclobutene (BCB), and other polymers.

The internal electrodes may have a double layered structure in which they are spaced apart from each other at a predetermined interval.

DESCRIPTION OF THE PREFERRED EMBODIMENTS

Hereinafter, exemplary embodiments of the present invention will be described in detail with reference to the accompanying drawings.

Figure 1:
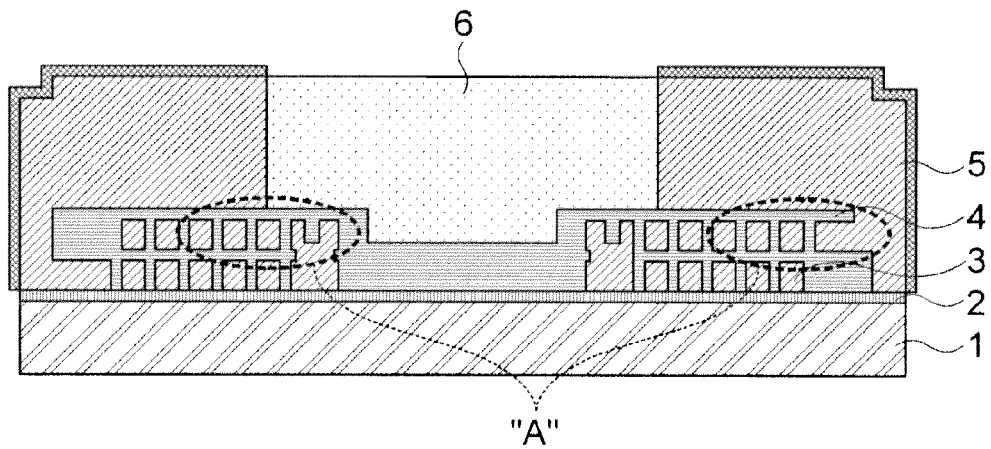
FIG. 1 is a schematic diagram showing a common mode filter structure of the related art.
Figure 2:
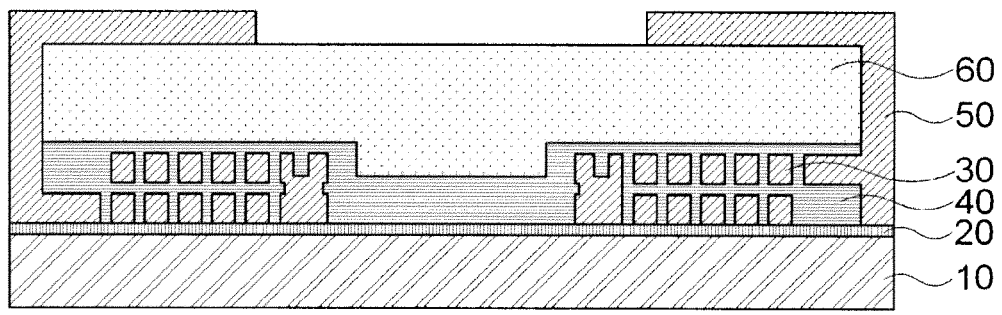
FIG. 2 is a conceptual diagram showing a cross-sectional structure of a thin film type common mode filter according to an exemplary embodiment of the present invention.

FIG. 2 is a conceptual diagram showing a cross-sectional structure of a thin film type common mode filter according to an exemplary embodiment of the present invention.

Referring to FIG. 2, the thin film type common mode filter according to the exemplary embodiment of the present invention includes an external electrode terminal 50 having a vertical section and a horizontal section; an internal electrode 30 having a side surface to which the vertical section of the external electrode terminal 50 is connected; and a ferrite resin layer 60 formed in a spaced space between the horizontal section of the external electrode terminal 50 and the internal electrode 30 to decrease a parasitic capacitance component.

The thin film type common mode filter according to the exemplary embodiment of the present invention includes a base substrate 10 made of an insulating material; a first insulating layer 20 formed on the base substrate 10; coil-shaped internal electrodes 30 formed on the first insulating layer 20; a second insulating layer 40 formed on the internal electrodes 30; an external electrode terminal 50 having a vertical section connected to a side surface of the internal electrode 30 and a horizontal section extended from an upper end of the vertical section toward a horizontal direction to thereby form a parallel surface spaced apart from the internal electrode 30 by a predetermined distance; and a ferrite resin layer 60 formed between the horizontal section of the external electrode terminal 50 and the internal electrode 30.

FIGS. 3A to 3F are conceptual diagrams sequentially showing a manufacturing process of a thin film type common mode filter according to the exemplary embodiment of the present invention.

Figure 3A:
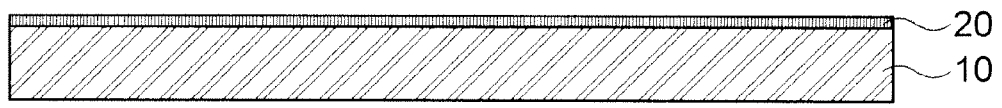
FIGS. 3A to 3F are conceptual diagrams sequentially showing a manufacturing process of the thin film type common mode filter according to the exemplary embodiment of the present invention.

As shown in FIG. 3A the present invention, the first insulating layer 20 is formed on the base substrate 10.

Here, the base substrate 10 may be manufactured by using an insulating material, for example, a ferrite material.

In addition, the first insulating layer 20 may be manufactured by using any one material selected from the group consisting of polyimide, an epoxy resin, benzocyclobutene (BCB), and other polymers, and by controlling impedance by controlling a thickness of a spin coating layer.

Figure 3B:
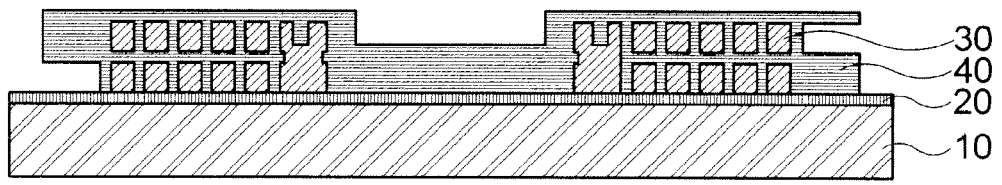

In addition, as shown in FIG. 3B, the internal electrode 30 and the second insulating layer 40 may be formed on the first insulating layer 20.

Figure 4:
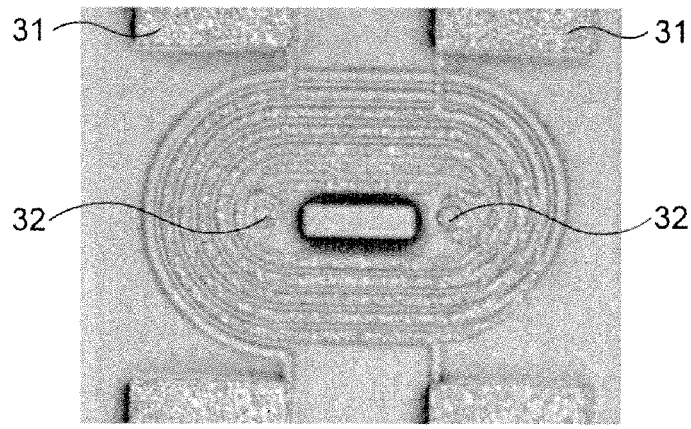
FIG. 4 is a photograph showing a structure of an internal electrode according to the exemplary embodiment of the present invention.

Here, the internal electrode 30 may be manufactured in a coil form as shown in FIG. 4, wherein one end of the coil form is an exposed end 31 connected to a side of the external electrode terminal, and the other end of the coil form is a connection end 32 grounding the plurality of internal electrodes 30.

In addition, the second insulating layer 40 may be made of any one material selected from the group consisting of polyimide, an epoxy resin, BCB, and other polymers, and formed by a photo via process.

Here, in the photo via process, a specific development ink including an insulating resin is used as an insulating layer and the insulating layers are multilayered.

Here, the internal electrodes 30 may have a double layered structure in which they are spaced apart from each other at a predetermined interval, and the second insulating layer 40 is formed so as to completely receive the internal electrode 30.

Figure 3C:
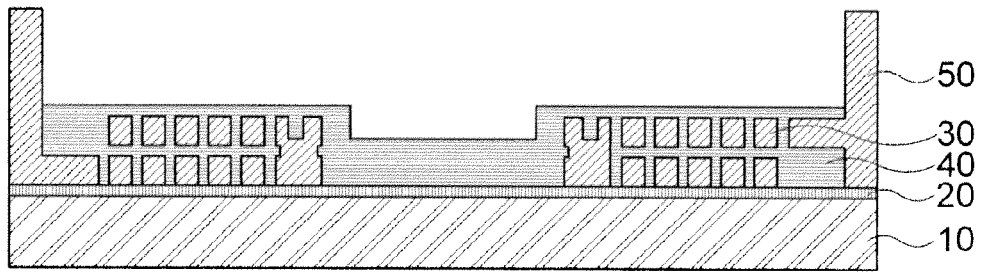

In addition, as shown in FIG. 3C, the external electrode terminal 50 is formed on the second insulating layer 40. Here, the external electrode terminal 50 has a vertical section connected to a side surface of the internal electrode 30 and a horizontal section extended from an upper end of the vertical section toward a horizontal direction to thereby form a parallel surface spaced apart from the internal electrode 30 by a predetermined distance.

Figure 3D:
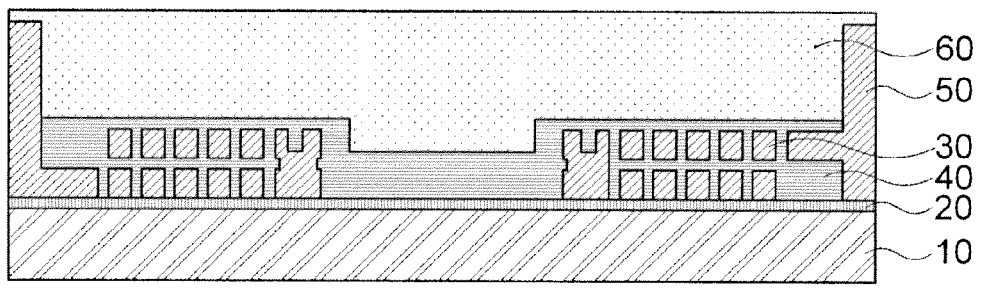

In addition, as shown in FIG. 3D, the ferrite resin layer 60 is formed between the horizontal section of the external electrode terminal 50 and the internal electrode 30.

Here, the vertical section of the external electrode terminal 50 is protruded to have a predetermined height, and a spaced space between the external electrode terminal 50 and the internal electrode 30 is formed by a height at which the vertical section of the external electrode terminal 50 is protruded.

Here, the first ferrite resin layer 60 is formed so as to cover the entire upper surface of the second insulating layer 40.

Figure 3E:
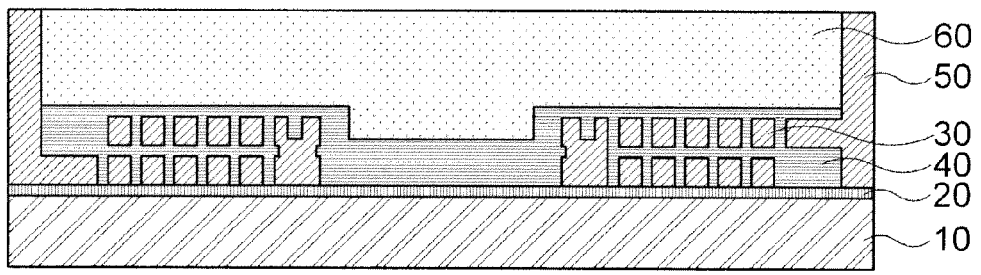
Figure 3F:
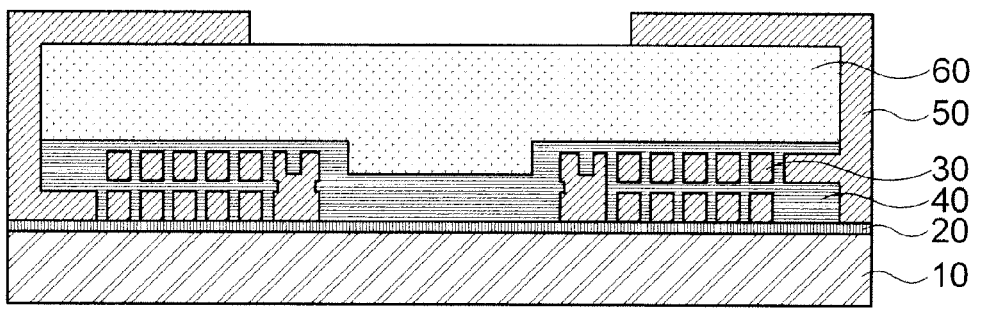

Thereafter, as shown in FIG. 3E, the top end portion of the vertical period of the external electrode terminal 50 is exposed by planarizing the top surface of the ferrite resin layer 60. And then, as shown in FIG. 3F, as forming the horizontal period of the external electrode terminal 50 on the ferrite resin layer 60, the external electrode terminal 50 is completed by forming to be extended horizontally in the top end of the vertical period of the external electrode terminal 50.

Figure 5A:
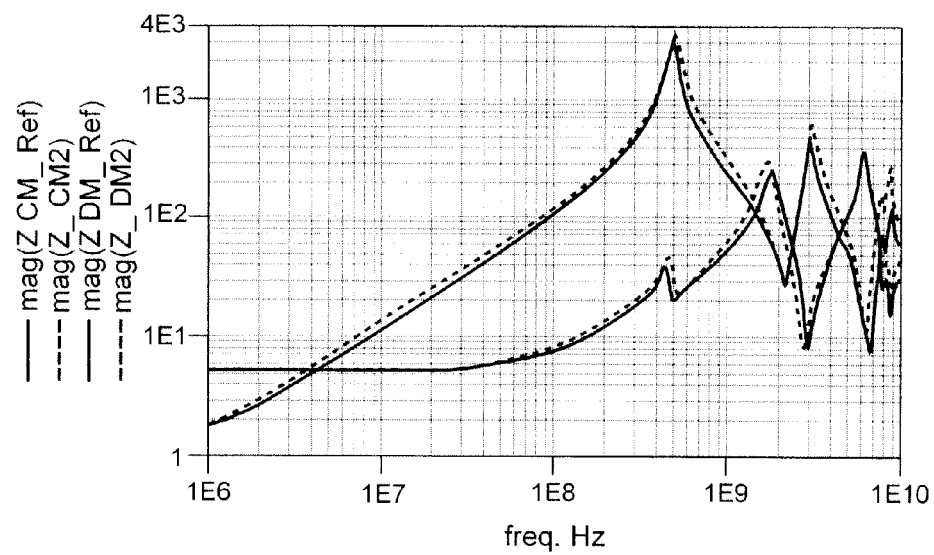
FIGS. 5A and 5B are graphs showing experimental results of performance of the thin film type common mode filter according to the exemplary embodiment of the present invention.
Figures 5B, 6:
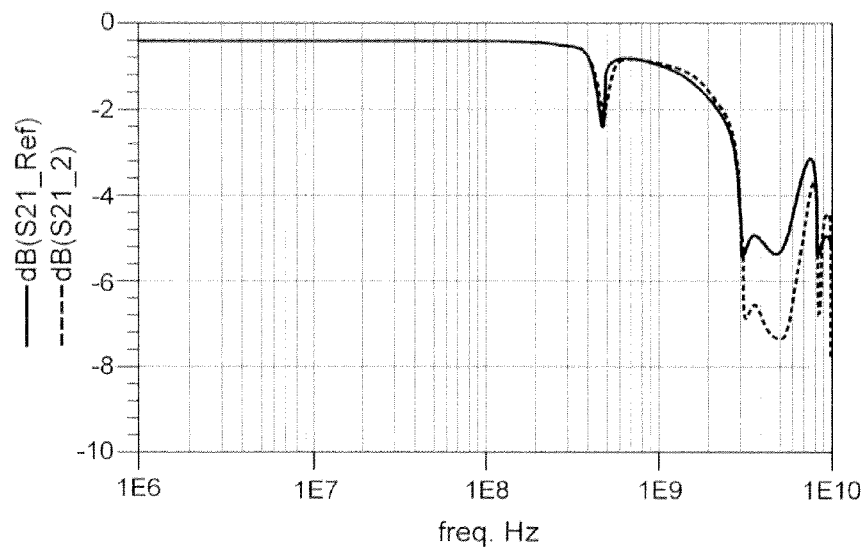
FIG. 6 is a table showing the experimental result of the performance of the thin film type common mode filter according to the exemplary embodiment of the present invention.

FIGS. 5A and 5B are graphs showing experimental results of performance of the thin film type common mode filter according to the exemplary embodiment of the present invention, and FIG. 6 is a table showing the experimental result of the performance of the thin film type common mode filter according to the exemplary embodiment of the present invention.

Referring to FIGS. 5A, 5B, and 6, it may be appreciated that a series resistance is maintained and impedance and a self resonant frequency (SRF) are also improved.

As described above, in the present invention, the ferrite resin layer is formed in the spaced space between the horizontal section of the external electrode terminal and the internal electrode in the common mode filter, thereby making it possible to decrease the parasitic capacitance component.

In addition, with the thin film type common mode filter of the present invention, the series resistance is maintained and impedance is improved to provide the excellent filtering effect, and the self resonant frequency (SRF) is improved to allow the frequency range capable of implementing performance to be wide, and in particular, the filtering is excellent at a high frequency.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. A thin film type common mode filter comprising:
   an external electrode terminal having a vertical section and a horizontal section;

an internal electrode having a side surface to which the vertical section of the external electrode terminal is connected;
a first insulating layer disposed below the internal electrode; and
a ferrite resin layer made only of ferrite resin material therein and formed at a distance between the horizontal section of the external electrode terminal and a second insulating layer embedding the internal electrode therein to decrease a parasitic capacitance component,
wherein the ferrite resin layer is in contact with a horizontal surface of the horizontal section of the external electrode terminal and is in direct contact with a horizontal surface of the second insulating layer.

2. The thin film type common mode filter according to claim 1, wherein the ferrite resin layer does not include a coil conductor.

3. A thin film type common mode filter comprising:
a base substrate made of an insulating material;
a first insulating layer formed on the base substrate;
a coil-shaped internal electrode formed on the first insulating layer;
a second insulating layer embedding the coil-shaped internal electrode therein;
an external electrode terminal having a vertical section connected to a side surface of the coil-shaped internal electrode and a horizontal section extended from an upper end of the vertical section toward a horizontal direction to thereby form a parallel surface spaced apart from the coil-shaped internal electrode by a predetermined distance; and
a ferrite resin layer made only of ferrite resin material therein and formed between the horizontal section of the external electrode terminal and the coil-shaped internal electrode,
wherein the ferrite resin layer is in contact with a horizontal surface of a horizontal section of the external electrode terminal and is in direct contact with a horizontal surface of the second insulating layer.

4. The thin film type common mode filter according to claim 3, wherein the first insulating layer and the second insulating layer are made of any one material selected from the group consisting of polyimide, an epoxy resin, benzocyclobutene (BCB), and other polymers.

5. The thin film type common mode filter according to claim 3, wherein the coil-shaped internal electrode is composed of two layers which are spaced apart from one another at a predetermined interval.

6. The thin film type common mode filter according to claim 3, wherein the base substrate is made of a ferrite.

7. The thin film type common mode filter according to claim 3, wherein the ferrite resin layer does not include a coil conductor.

* * * * *